US012300704B2

(12) United States Patent
Wang et al.

(10) Patent No.: US 12,300,704 B2
(45) Date of Patent: May 13, 2025

(54) ARRAY BASE PLATE AND METHOD FOR MANUFACTURING THE SAME, DISPLAY PANEL

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Desheng Wang, Beijing (CN); Dawei Feng, Beijing (CN); Zhichao Yang, Beijing (CN); Jian Wang, Beijing (CN); Yong Zhang, Beijing (CN); Hui Li, Beijing (CN); Qi Deng, Beijing (CN); Lingfang Nie, Beijing (CN); Longhu Hao, Beijing (CN); Zanwu Guo, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/027,248

(22) PCT Filed: Apr. 26, 2022

(86) PCT No.: PCT/CN2022/089180
§ 371 (c)(1),
(2) Date: Mar. 20, 2023

(87) PCT Pub. No.: WO2023/206054
PCT Pub. Date: Nov. 2, 2023

(65) Prior Publication Data
US 2024/0355836 A1 Oct. 24, 2024

(51) Int. Cl.
*G02F 1/1362* (2006.01)
*G02F 1/1343* (2006.01)
(Continued)

(52) U.S. Cl.
CPC .... *H01L 27/1244* (2013.01); *G02F 1/134309* (2013.01); *G02F 1/136209* (2013.01);
(Continued)

(58) Field of Classification Search
CPC .......... G02F 1/13629; G02F 1/134309; G02F 1/136209; G02F 1/1368; H01L 27/1244; H01L 27/1288
See application file for complete search history.

(56) References Cited

U.S. PATENT DOCUMENTS 10,921,670 B1  2/2021  Chen et al.
2004/0080700 A1  4/2004  Kang
(Continued)

FOREIGN PATENT DOCUMENTS

CN  106773394 A  5/2017
CN  110488548 A  11/2019
(Continued)

*Primary Examiner* — James A Dudek
(74) *Attorney, Agent, or Firm* — WHDA, LLP

(57) ABSTRACT

The present application provides an array base plate and a method for manufacturing the same, a display panel, the array base plate including a substrate; a first conducting layer located at one side of the substrate, and including a plurality of data lines arranged in an array; a second conducting layer located at one side of the first conducting layer away from the substrate, and in direct contact with a part of a region of the first conducting layer, and including a pixel electrode and a compensating electrode; wherein an orthographic projection of the compensating electrode on the substrate is located within orthographic projections of the data lines on the substrate. The embodiments of the present (Continued)

application provide an array base plate with low cost, high preparation yield, and good reliability.

16 Claims, 6 Drawing Sheets

(51) Int. Cl.
*G02F 1/1368* (2006.01)
*H01L 27/12* (2006.01)
(52) U.S. Cl.
CPC ........ *G02F 1/13629* (2021.01); *G02F 1/1368* (2013.01); *H01L 27/1288* (2013.01)

(56) References Cited

U.S. PATENT DOCUMENTS

| | | | | |
|---|---|---|---|---|
| 2012/0146889 | A1* | 6/2012 | Kwak | G02F 1/13394 |
| | | | | 345/91 |
| 2020/0124929 | A1* | 4/2020 | Morinaga | G02F 1/136209 |
| 2021/0124440 | A1 | 4/2021 | Li et al. | |
| 2022/0102389 | A1 | 3/2022 | Wang et al. | |

FOREIGN PATENT DOCUMENTS

| CN | 210295063 U | 4/2020 |
|---|---|---|
| CN | 114280861 A | 4/2022 |

* cited by examiner

ARRAY BASE PLATE AND METHOD FOR MANUFACTURING THE SAME, DISPLAY PANEL

TECHNICAL FIELD

The present application relates to the technical field of displaying and, more particularly, to an array base plate and a method for manufacturing the same, a display panel.

BACKGROUND

With the rapid development of display technology, people are demanding higher and higher quality of display products. In the process of preparing display products, the process fluctuation is easy to lead to the wiring rupture in the display panel. In the subsequent preparation process or use process, the wiring rupture is easy to further expand, and then cause the circuit break, resulting in abnormal display.

SUMMARY

The embodiments of the present application employ the following technical solutions:

In the first aspect, the embodiments of the present disclosure provide an array base plate, including:
a substrate;
a first conducting layer located at one side of the substrate, and including a plurality of data lines arranged in an array;
a second conducting layer located at one side of the first conducting layer away from the substrate, and in direct contact with a part of a region of the first conducting layer, and including a pixel electrode and a compensating electrode; and
wherein an orthographic projection of the compensating electrode on the substrate is located within orthographic projections of the data lines on the substrate.

In some embodiments of the present application, an extending direction of the compensating electrode and an extending direction of each of the data lines are the same, and in the extending direction of the each of the data lines, a length of the compensating electrode is less than or equal to a length of the each of the data lines.

In some embodiments of the present application, in a direction perpendicular to an extending direction of the data lines, sizes of the orthographic projections of the data lines on the substrate are larger than or equal to a size of the orthographic projection of the compensating electrode on the substrate.

In some embodiments of the present application, the array base plate further includes a third conducting layer located between the first conducting layer and the substrate; the third conducting layer includes a plurality of gate lines arranged in an array, and the gate lines intersect and are insulated with the data lines; and
a part of each of the data lines located between two adjacent gate lines includes a first line segment, a bending part, and a second line segment connected sequentially; and the compensating electrode covers at least a part of regions of the first line segment and the second line segment.

In some embodiments of the present application, the each of the data lines further include a third line segment and a fourth line segment, and the third line segment is connected to an end of the first line segment away from the bending part; the fourth line segment is connected to an end of the second line segment away from the bending part; an orthographic projection of the third line segment on the substrate and an orthographic projection of the fourth line segment on the substrate overlap with orthographic projections of the gate lines on the substrate, respectively;
wherein the compensating electrode covers at least a part of regions of the third line segment and the fourth line segment.

In some embodiments of the present application, the compensating electrode covers the first line segment, the second line segment, the third line segment and the fourth line segment.

In some embodiments of the present application, a width of the third line segment along a direction perpendicular to an extending direction of the third line segment is larger than a width of the first line segment along a direction perpendicular to an extending direction of the first line segment; a width of the fourth line segment along a direction perpendicular to an extending direction of the fourth line segment is larger than a width of the second line segment along a direction perpendicular to an extending direction of the second line segment.

In some embodiments of the present application, a width of a part of the compensating electrode covering the third line segment along the direction perpendicular to the extending direction of the third line segment is larger than a width of a part of the compensating electrode covering a main structure of the first line segment along the direction perpendicular to the extending direction of the first line segment; and
a width of a part of the compensating electrode covering the fourth line segment along the direction perpendicular to the extending direction of the fourth line segment is larger than a width of a part of the compensating electrode covering a main structure of the second line segment along the direction perpendicular to the extending direction of the second line segment.

In some embodiments of the present application, the pixel electrode is located at a position defined by two adjacent data lines and two adjacent gate lines, and the minimum distance between the pixel electrode and the compensating electrode is larger than or equal to 5 μm.

In some embodiments of the present application, the array base plate further includes transistor, and the first conducting layer further includes a first electrode of the transistor and a second electrode of the transistor, and the pixel electrode is in direct contact with a part of a region of the first electrode of the transistor, and the data lines are connected to the second electrode of the transistor.

In some embodiments of the present application, the first electrode of the transistor includes a first portion parallel to an extending direction of each of the gate lines, a second portion parallel to an extending direction of each of the gate lines, and a connecting portion connecting the first portion and the second portion; and
a minimum distance between the second portion and each of the gate lines is larger than or equal to a minimum distance between the first portion and the each of the gate lines, and the pixel electrode covers the second portion.

In some embodiments of the present application, a minimum distance between the second portion and the each of the gate lines is larger than a minimum distance between the first portion and the each of the gate lines, and the pixel electrode covers the second portion and a part of the connecting portion.

In some embodiments of the present application, the array base plate further includes a semiconductor layer located between the first conducting layer and the third conducting layer, a part of a region of the semiconductor layer is in direct contact with the first conducting layer; and the semiconductor layer includes a first active portion, the orthographic projection of the compensating electrode on the substrate is located within an orthographic projection of the first active portion on the substrate, and the orthographic projections of the data lines on the substrate are located within the orthographic projection of the first active portion on the substrate.

In some embodiments of the present application, the semiconductor layer further includes a second active portion, the first active portion and the second active portion are connected, an orthographic projection of the first electrode of the transistor on the substrate and an orthographic projection of the second electrode of the transistor on the substrate are located within an orthographic projection of the second active portion on the substrate, respectively; and the pixel electrode further covers a side surface of the second active portion away from the second electrode of the transistor, the pixel electrode is in direct contact with the side surface.

In some embodiments of the present application, the array base plate further includes a fourth conducting layer, and the fourth conducting layer is located at a side of the second conducting layer away from the substrate and is insulated from the second conducting layer;

an orthographic projection of the fourth conducting layer on the substrate overlaps with an orthographic projection of the pixel electrode on the substrate, orthographic projections of the data lines on the substrate and orthographic projections of the gate lines on the substrate, respectively; and the fourth conducting layer has a plurality of slots, and orthographic projections of regions where the slots are located on the substrate overlap with the orthographic projection of the pixel electrode on the substrate.

In some embodiments of the present application, the third conducting layer further includes a storage electrode line disposed parallel to the gate lines, the storage electrode line is electrically connected to the fourth conducting layer via a through hole; and an orthographic projection of the storage electrode line on the substrate overlaps with the orthographic projection of the pixel electrode on the substrate, and the orthographic projection of the storage electrode line on the substrate overlaps with the orthographic projection of the fourth conducting layer on the substrate.

A second aspect, a display panel, including the array base plate stated above.

A third aspect, a method for manufacturing the array base plate, applied to manufacture the array base plate stated above, the method includes:

providing the substrate;

forming a semiconductor thin film;

forming a first conducting thin film;

patterning the semiconductor thin film and the first conducting thin film at a same time to obtain the semiconductor layer and the first conducting layer; wherein the first conducting layer includes the plurality of data lines arranged in the array;

forming a second conducting layer, and the second conducting layer in direct contact with the part of the region of the first conducting layer, and including the pixel electrode and the compensating electrode;

wherein the orthographic projection of the compensating electrode on the substrate is located within orthographic projections of the data lines on the substrate.

In some embodiments of the present application, patterning the semiconductor thin film and the first conducting thin film at a same time to obtain the semiconductor layer and the first conducting layer includes:

forming a light-blocking thin film on the first conducting thin film;

patterning the light-blocking thin film by using a halftone mask to obtain a first light-blocking pattern;

patterning the semiconductor thin film and the first conducting thin film by using the first light-blocking pattern as a mask, to obtain a first semiconductor pattern and a first conducting pattern;

etching the first light-blocking pattern to obtain a second light-blocking pattern;

patterning the first semiconductor pattern and the first conducting pattern by using the second light-blocking pattern as the mask to obtain the semiconductor layer and the first conducting layer at the same time; and removing the second light-blocking pattern.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly described below. Apparently, the figures that are described below are merely embodiments of the present application, and a person skilled in the art can obtain other figures according to these figures without paying creative work.

DETAILED DESCRIPTION

Figure 1:
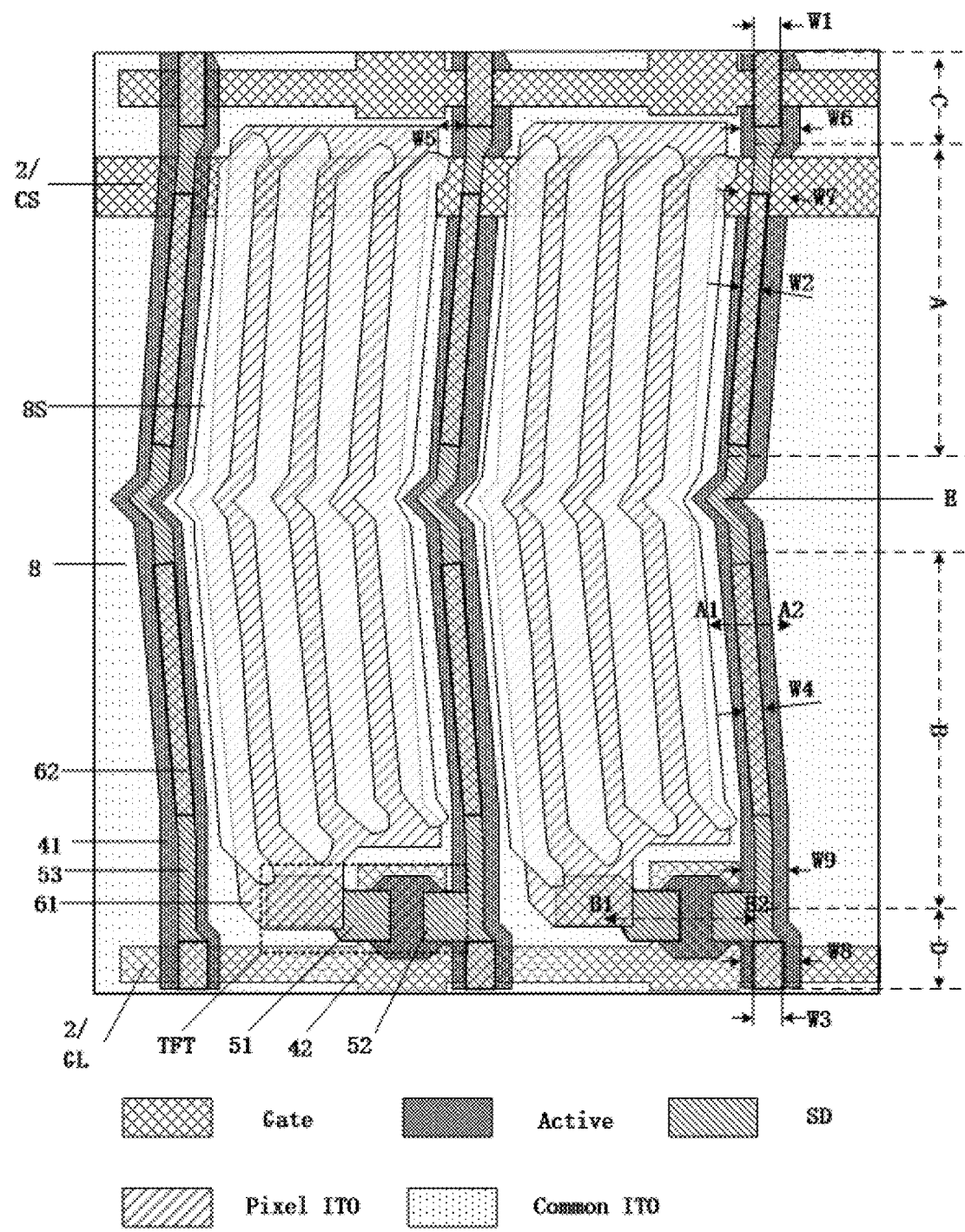
FIG. 1 is a top view structural diagram of an array base plate according to an embodiment of the present application.

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the drawings, in order for clarity, the thicknesses of the areas and the layers might be exaggerated. In the drawings, the same reference numbers represent the same or similar components, and therefore the detailed description on them are omitted. Moreover, the drawings are merely schematic illustrations of the present disclosure, and are not necessarily drawn to scale.

In the embodiments of the present application, unless stated otherwise, the meaning of "plurality of" is "two or more". The terms that indicate orientation or position relations, such as "upper", are based on the orientation or position relations shown in the drawings, and are merely for conveniently describing the present application and simplifying the description, rather than indicating or implying that the component or element must have the specific orientation and be constructed and operated according to the specific orientation. Therefore, they should not be construed as a limitation on the present application.

Unless stated otherwise in the context, throughout the description and the claims, the term "comprise" is interpreted as the meaning of opened containing, i.e., "including but not limited to". In the description of the present disclosure, the terms "one embodiment", "some embodiments", "exemplary embodiments", "example", "specific example" or "some examples" are intended to indicate that specific features, structures, materials or characteristics related to the embodiment or example are comprised in at least one embodiment or example of the present application. The illustrative indication of the above terms does not necessarily refer to the same one embodiment or example. Moreover, the specific features, structures, materials or characteristics may be comprised in any one or more embodiments or examples in any suitable manner.

In the embodiments of the present application, terms such as "first" and "second" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features.

Figure 6:
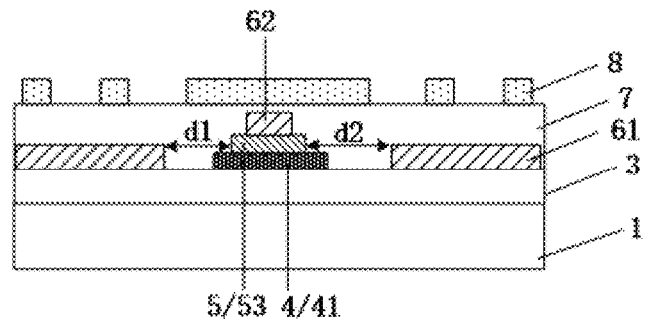

An array base plate provided in the embodiments of the present application, referring to FIG. 1 and FIG. 6, includes:
 a substrate 1;
 a first conducting layer 5 located at one side of the substrate 1, and including a plurality of data lines 53 arranged in an array;
 a second conducting layer 6 located at one side of the first conducting layer 5 away from the substrate 1, and in direct contact with a part of a region of the first conducting layer 5, and the second conducting layer 6 including a pixel electrode 61 and a compensating electrode 62; and
 wherein an orthographic projection of the compensating electrode 62 on the substrate 1 is located within orthographic projections of the data lines 53 on the substrate 1.

It should be noted that FIG. 6 is a cross-sectional view of FIG. 1 along a direction of A1A2.

The specific material of the substrate 1 above is not limited here. For example, the substrate may be a rigid substrate, such as glass.

In an exemplary embodiment, the material of the first conducting layer 5 may be a metal material, for example, copper.

Exemplary, the first conducting layer 5 is used to prepare data lines 53 in the conducting patterns, the source electrode of the transistor TFT, and the drain electrode of the transistor TFT.

In some embodiments, the first conducting layer 5 is also referred to as the SD layer, and the SD layer in FIG. 1 represents the first conducting layer 5.

The specific structure of the data lines 53 is not limited here. For example, the data lines 53 may include straight line segments; alternatively, the data lines 53 may include polyline segments consisting of a plurality of straight-line segments, which may be determined according to the actual design.

In an exemplary embodiment, a material of the second conducting layer 6 may be a light-transmitting conducting material, for example, indium tin oxide (ITO), indium zinc oxide (IZO).

In some embodiments, the second conducting layer 6 is also referred to as the Pixel ITO layer, and the Pixel ITO layer in FIG. 1 represents the second conducting layer 6.

The second conducting layer 6 includes the pixel electrode 61 and the compensating electrode 62, wherein the pixel electrode 61 is located at a region between two adjacent data lines 53 and the pixel electrode 61 and the compensating electrode 62 separately disposed.

The number of the compensating electrode 62 mentioned above is not set here, and may be determined according to the actual situation.

For example, the compensating electrode 62 may be disposed on only one data line 53 in the plurality of data lines 53; or one compensating electrode 62 may be disposed on one data line 53. Alternatively, a plurality of compensating electrodes 62 disconnected may be disposed on a data line 53.

In an exemplary embodiment, the second conducting layer 6 is in direct contact with a part of a region of the first conducting layer 5, including but not limited to the following:

First, the pixel electrode 61 in the second conducting layer 6 is in direct contact with the drain electrode of the transistor TFT in the first conducting layer 5.

Second, the compensating electrode 62 in the second conducting layer 6 is in direct contact with data lines 53 in first conducting layer 5, and the compensating electrode 62 covers a part of regions of the data lines 53.

In an exemplary embodiment, that the orthographic projection of the compensating electrode 62 on the substrate 1 is located within orthographic projections of the data lines on the substrate 1 refers to: the outer contour of the orthographic projection of the compensating electrode 62 on the substrate 1 is located within the outer contours of the orthographic projections of data lines 53 on the substrate 1. Alternatively, the outer contour of the orthographic projection of the compensating electrode 62 on the substrate 1 overlaps with the outer contours of the orthographic projections of data lines 53 on the substrate 1.

Figure 2:
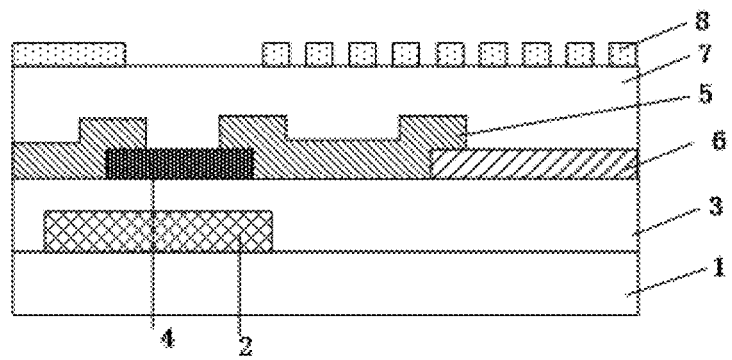
FIG. 2 and FIG. 4 are schematic diagrams of the structure of an array base plate in a related art according to an embodiment of the present application.
Figure 3:
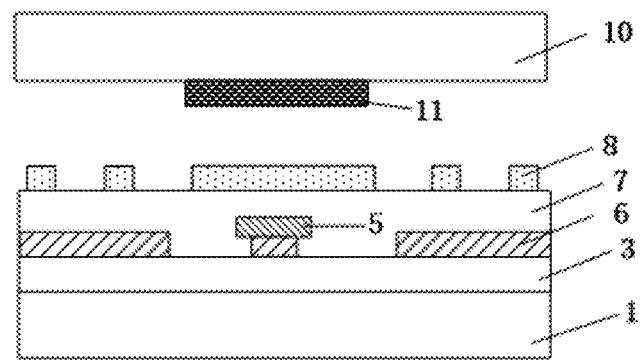
FIG. 3 is a schematic diagram of the structure of a display panel in a related art according to an embodiment of the present application.

In related art, for the array base plate prepared by the 6Mask process, referring to FIGS. 2 and 3, the second conducting layer 6 is located between the first conducting layer 5 and the substrate 1, and the first conducting layer 5 covers a part of the second conducting layer 6. However, in order to reduce costs and optimize the process, the 5Mask process is used to prepare the array base plate, due to the orthographic projection of the first conducting layer 5 of the array base plate of the 5Mask process on the substrate 1 is located within the orthographic projection of the semiconductor layer 4 on the substrate 1, in order to avoid a second conducting layer 6 short-circuited with semiconductor layer 4, in the array base plate according to an embodiment of the present application, a second conducting layer 6 is disposed at one side of the first conducting layer 5 away from the substrate 1, and the second conducting layer 6 includes a pixel electrode 61 and a compensating electrode 62; and the second conducting layer 6 is in direct contact with a part of a region of the first conducting layer 5, further, an orthographic projection of the compensating electrode 62 on the substrate 1 is located within orthographic projections of the data lines 53 on the substrate 1. In this way, while saving a mask and reducing the preparation cost, as shown in FIG. 6, the compensating electrode 62 prepared in the same layer as the pixel electrode 61 is also covered on at least a part of the data lines 53. When cracks or gaps appear in the data lines 53 during the preparation of the array base plate 53, the compensating electrode 62 may play a role in repairing the data lines 53 and avoids data lines 53 disconnecting, thereby improving the preparation yield of the array base plate and improving product efficiency.

It should be noted that the array base plates provided in the embodiments of the present application are prepared using the 5Mask process, wherein the 5Mask process refers to that in the preparation process of the array base plate, 5 masks are used. 6Mask process refers to that in the preparation process of the array base plate, 6 masks are used. Since the refinement of the mask and preparation requirements are high, the design and manufacture of the mask occupies an important component of the cost of the display product, saving a mask plate, can reduce the manufacturing cost of the array base plate to a large extent.

In some embodiments of the present application, an extending direction of the compensating electrode 62 and an extending direction of each of the data lines 53 are the same, and in the extending direction of the each of the data lines 53, a length of the compensating electrode 62 is less than or equal to a length of the each of the data lines 53.

In an exemplary embodiment, that in the extending direction of the each of the data lines 53, a length of the compensating electrode 62 is less than or equal to a length of the each of the data lines 53 includes, but is not limited to, the following:

First, in the extending direction of data lines 53, the length of the compensating electrode 62 is less than the length of each of the data lines 53. That is, only a part of the data lines 53 are covered with the compensating electrode 62, and the other part is not provided with the compensating electrode 62, so that in the extending direction of the data lines 53, the total length of the compensating electrode 62 is less than the total length of the data lines 53. Alternatively, for each data line 53, a part of a region of the data line 53 is provided with the compensating electrode 62, and a part of a region of the data line 53 is not provided with the compensating electrode 62, so that the length of compensating electrode 63 on the data line 53 is less than the length of the data line 53.

Second, in the extending direction of the data lines 53, the length of compensating electrode 62 is equal to the length of data lines 53. For all data lines 53, the data lines 53 are provided with compensating electrodes 62, and the total length of the compensating electrode 62 is equal to the total length of the data lines 53. For one of the data lines 53, the data line 53 is provided with a compensating electrode 62 along the extending direction of the data line 53, the length of the compensating electrode 62 is equal to the length of the data line 53.

When the design allows, the compensation electrode 62 may be disposed on each data line 53, and the length of the compensation electrode 62 is equal to the length of the data line 53 in the extending direction of the data line 53. In this way, it can be ensured to the greatest extent that when cracks and gaps occurs in the data line 53, the compensation electrode 62 plays a role in repairing the data line 53, avoiding the occurrence of adverse problems caused by the disconnection of the data line 53, and improving the preparation yield of the array substrate.

In some embodiments of the present application, in a direction perpendicular to an extending direction of the data lines 53, sizes of the orthographic projections of the data lines 53 on the substrate 1 are larger than or equal to a size of the orthographic projection of the compensating electrode 62 on the substrate 1.

In an exemplary embodiment, referring to FIG. 6, in the direction perpendicular to the extending direction of the data lines 53, the sizes of the orthographic projections of the data lines 53 on the substrate 1 are larger than the size of the orthographic projection of the compensating electrode 62 on the substrate 1.

It may be understandable that without considering the length of the compensating electrode 62, referring to FIG. 6, the outer contour of the orthographic projection of the compensating electrode 62 on the substrate 1 is located within the outer contours of the orthographic projections of the data lines 53 on the substrate 1.

Figure 7:
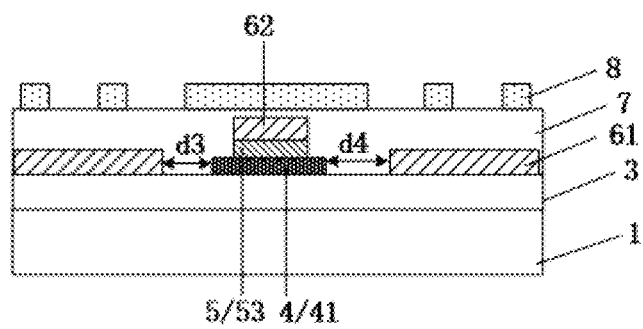

In an exemplary embodiment, referring to FIG. 7, in the direction perpendicular to the extending direction of the data lines 53, the sizes of the orthographic projections of the data lines 53 on the substrate 1 are equal to the size of the orthographic projection of the compensating electrode 62 on the substrate 1.

It is understandable that without considering the length of the compensating electrode 62, referring to FIG. 7, the outer contour of the orthographic projection of the compensating electrode 62 on the substrate 1 overlaps with the outer contours of the orthographic projections of the data lines 53 on the substrate 1.

In practical application, the compensation electrode 62 is located in the middle area of the data lines 53, so that the edge of the compensation electrode 62 will not exceed the edge of the data lines 53 even in the case of fluctuation of the preparation process, which avoids the short circuit between the compensation electrode 62 and the pixel electrode 61 arranged in the same layer due to the short distance, and improves the preparation yield of the array substrate.

In some embodiments of the present application, referring to FIG. 1, the array base plate further includes a third conducting layer 2 located between the first conducting layer 5 and the substrate 1; the third conducting layer 2 includes a plurality of gate lines GL arranged in an array, and the gate lines GL intersect and are insulated with the data lines 53; and a part of each of the data lines 53 located between two adjacent gate lines GL includes a first line segment A, a bending part E, and a second line segment B connected sequentially; and the compensating electrode 62 covers at least a part of regions of the first line segment A and the second line segment B.

In an exemplary embodiment, a gate insulation layer 3 is disposed between the gate lines GL and the data lines 53.

In an exemplary embodiment, in the preparation process of the array base plate, the structural pattern of the bending part E is more complex, and its preparation process is more difficult, and when the compensating electrode 62 is prepared on the bending part E, the preparation accuracy is required to be higher, otherwise it is easy to cause short circuit occurring between the compensating electrode 62 on the bending part E and adjacent pixel electrode 61, resulting in the array base plate to be used abnormally. When the preparation process is limited, the compensating electrode 62 is configured to cover at least a part of the regions of the first line segment A and the second line segment B.

It should be noted that the compensation electrode 62 covers at least a part of the regions of the first line segment A and the second line segment B, including but not limited to the following cases:

The compensating electrode 62 covers a part of the region of the first line segment A.

Alternatively, the compensating electrode 62 covers a part of the region of the second line segment B.

Alternatively, compensating electrode 62 covers the entire region of the first line segment A.

Alternatively, the compensating electrode 62 covers the entire region of the second line segment B.

Alternatively, the compensating electrode 62 covers a part of the region of the first line segment A, and the compensating electrode 62 also covers a part of the region of the second line segment B.

Alternatively, the compensating electrode 62 covers the entire region of the first line segment A, and the compensating electrode 62 further covers the entire region of the second line segment B.

In an embodiment of the present application, by configuring that the compensating electrode 62 covers at least a part of regions of the first line segment A and the second line segment B, and configuring that the compensating electrode 62 does not cover the bending part E, ensuring that there is no short circuit between the compensating electrode 62 and the adjacent pixel electrode 61, and when cracks or gaps appear in the data lines 53, it is ensured to a largest extent that the compensating electrode 62 may play a role in repairing the data lines 53 and avoiding the occurrence of adverse problems of the array base plate caused by the disconnection of the data line 53, thereby improving the preparation yield of the array base plate.

In some embodiments of the present application, referring to FIG. 1, each of the data lines 53 further include a third line segment C and a fourth line segment D, and the third line segment C is connected to an end of the first line segment A away from the bending part E; the fourth line segment D is connected to an end of the second line segment B away from the bending part E; an orthographic projection of the third line segment C on the substrate 1 and an orthographic projection of the fourth line segment D on the substrate 1 overlap with orthographic projections of the gate lines GL on the substrate 1, respectively;

wherein the compensating electrode 62 cover at least a part of regions of the third line segment C and the fourth line segment D.

In an exemplary embodiment, that the orthographic projection of the third line segment C on the substrate 1 and the orthographic projection of the fourth line segment D on the substrate 1 overlap with the orthographic projections of the gate lines GL on the substrate 1, respectively includes: the orthographic projection of the third line segment C on the substrate 1 overlaps with the orthographic projections of the gate lines GL on the substrate 1, and the orthographic projection of the fourth line segment D on the substrate 1 overlaps with the orthographic projections of the gate lines GL on the substrate 1, wherein the "overlaps" refers to at least partially overlapping.

In an exemplary embodiment, the compensating electrode 62 covers at least a part of regions of the third line segment C and the fourth line segment D including, but not limited to, the following: the compensating electrode 62 covers a part of the region of the third line segment C. Alternatively, the compensating electrode 62 covers the third line segment C. Alternatively, the compensating electrode 62 covers a part of the region of the fourth line segment D. Alternatively, the compensating electrode 62 covers the fourth line segment D. Alternatively, the compensating electrode 62 covers a part of the region of the third line segment C and the compensating electrode 62 covers a part of the region of the fourth line segment D. Alternatively, the compensating electrode 62 covers the third line segment C and also covers the fourth line segment D.

In the array base plate provided in an embodiment of the present application, since the projection of the third line segment C overlaps with the projection of the gate lines GL, the projection of the fourth line segment D overlaps with the projection of sector GL, that is, in the process of preparing the data lines 53, the third line segment C of the data lines 53 and the fourth line segment of the data lines 53 D need to climb from the gate lines GL, near the climbing position, due to storage stress concentration, the data lines 53 are extremely easy to generate cracks or gaps. In the array base plate according to the embodiments of the present application, configuring that the compensating electrode 62 covers at least a part of regions of the third line segment C and the fourth line segment D, thus when cracks or gaps appear in the data lines 53, it is ensured that the compensating electrode 62 may play a role in repairing the data lines 53 and avoiding the occurrence of adverse problems of the array base plate caused by the disconnection of the data line 53, thereby improving the preparation yield of the array base plate.

In some embodiments of the present application, the compensating electrode 62 covers the first line segment A, the second line segment B, the third line segment C and the fourth line segment D.

In an embodiment of the present application, the compensating electrode 62 covers regions of the data lines other than the bending part E, in ensuring that there is no short circuit happening between the compensating electrode 62 and the adjacent pixel electrode 61, when cracks or gaps appear in the data lines 53, it is ensured to a largest extent that the compensating electrode 62 may play a role in repairing the data lines 53 and avoiding the occurrence of adverse problems of the array base plate caused by the disconnection of the data line 53, thereby improving the preparation yield of the array base plate.

In some embodiments of the present application, referring to FIG. 1, a width W1 of the third line segment C along a direction perpendicular to an extending direction of the third line segment C is larger than a width W2 of the first line segment A along a direction perpendicular to an extending direction of the first line segment A; a width W3 of the fourth line segment D along a direction perpendicular to an extending direction of the fourth line segment D is larger than a width W4 of the second line segment B along a direction perpendicular to an extending direction of the second line segment B.

In an embodiment of the present application, the third line segment C of the data lines 53 and the fourth line segment D of the data lines 53 need to climb from the gate lines GL, the data lines 53 near the climbing position are easy to generate cracks or gaps due to the concentration of storage stress. In order to avoid large local internal stresses in the third line segment C and the fourth line segment D, the width W1 of the third line segment C is set to be larger than the width W2 of the first line segment A and the width W3 of the fourth line segment D is set to be larger than the width W4 of the second line segment B, so that the stress is more dispersed in the third line segment C and the fourth line segment D, respectively, reducing the probability of local generating cracks or gaps, and improving the array base plate of preparation yield.

In some embodiments of the present application, a width (for example, W1) of a part of the compensating electrode 62 covering the third line segment C along the direction perpendicular to the extending direction of the third line segment C is larger than a width (for example, W2) of a part of the compensating electrode 62 covering a main structure of the first line segment A along the direction perpendicular to the extending direction of the first line segment; and a width (for example, W3) of a part of the compensating electrode 62 covering the fourth line segment D along the direction perpendicular to the extending direction of the fourth line segment D is larger than a width (for example, W4) of a part of the compensating electrode 62 covering a main structure of the second line segment B along the direction perpendicular to the extending direction of the second line segment B.

It should be noted that the structure shown in FIG. 1 is illustrated by taking the case as an example in which the width of a part of the compensating electrode 62 covering the third line segment C along the direction perpendicular to the extending direction of the third line segment C is equal to the width of the third line segment C along the direction perpendicular to the extending direction of the third line segment C, thus the width of a part of the compensating electrode 62 covering the third line segment C along the direction perpendicular to the extending direction of the third line segment C may be marked with W1, the width of the third line segment C along the direction perpendicular to the extending direction of the third line segment C may be marked with W1, W2, W3 and W4, which is similar to W1, and will not be repeated here.

In an exemplary embodiment, the first line segment A includes one end connected to the third line segment C, one end connected to the bending part E, and the main structure. When the width of the first line segment A is different from the width of the third line segment C, the width of the end of the first line segment A that is connected to the third line segment C is between the main structure of the first line segment A and the third line segment C. Here, in order to more accurately describe the size relationship between the part of the compensation electrode 62 covering the third line segment C and the part of the compensation electrode 62 covering the first line segment A, the main part of the first line segment A with a relatively uniform width is taken as an example to illustrate that the width (for example, W1) of a part of the compensating electrode 62 covering the third line segment C along the direction perpendicular to the extending direction of the third line segment C is larger than the width (for example, W2) of a part of the compensating electrode 62 covering the main structure of the first line segment A along the direction perpendicular to the extending direction of the first line segment A.

In some embodiments of the present application, the pixel electrode 61 is located at a position defined by two adjacent data lines 53 and two adjacent gate lines GL, and the minimum distance W5 between the pixel electrode 61 and the compensating electrode 62 is larger than or equal to 5 μm.

In the array base plate provided in an embodiment of the present application, since the pixel electrode 61 and the compensating electrode 62 are located in the same layer, such as the Pixel ITO layer shown in FIG. 1, in order to avoid that the pixel electrode 61 and the compensating electrode 62 are short-circuited, the minimum distance W5 between the pixel electrode 61 and the compensating electrode 62 is set to be larger than or equal to 5 μm, thus ensuring a safe distance between the two and improving the quality of the array base plate.

Figure 5:
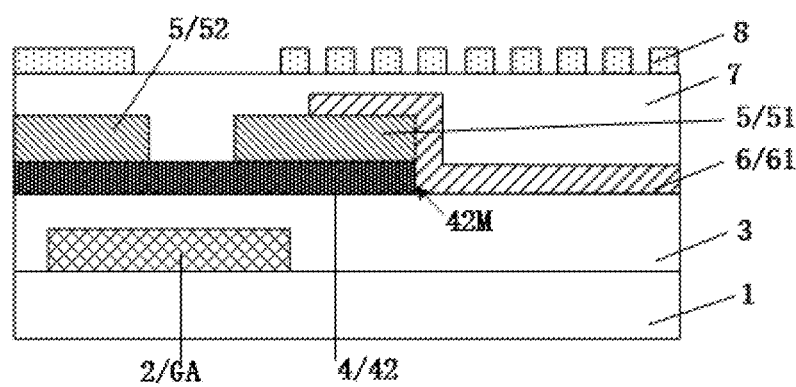
FIGS. 5-9 are schematic diagrams of the structures of five array base plates according to an embodiment of the present application.

In some embodiments of the present application, referring to FIG. 1 and FIG. 5, the array base plate further includes transistor TFT, and the first conducting layer 5 further includes a first electrode 51 of the transistor TFT and a second electrode 52 of the transistor TFT, and the pixel electrode 61 is in direct contact with a part of a region of the first electrode 51 of the transistor TFT, and the data lines 53 are connected to the second electrode 52 of the transistor TFT.

FIG. 5 is a cross-sectional view of FIG. 1 along the direction of B1B2.

These transistors may be thin film transistors (TFT transistors) or complementary metal oxide semiconductor transistors (CMOS transistors). In addition, the transistor may be N-type transistor, or, may also be P-type transistor, which may be specifically determined according to the actual situation. An embodiment of the present application is illustrated with a transistor as a thin film transistor.

In an exemplary embodiment, referring to FIG. 1 or FIG. 5, the pixel electrode 51 partially covers the first electrode 51 of the transistor TFT, and the two are in direct contact conduction.

In an exemplary embodiment, the third conducting layer 2 further includes a gate electrode GA of the transistor TFT.

In some embodiments of the present application, the first electrode 51 of the transistor TFT includes a first portion 51A parallel to an extending direction of each of the gate lines GL, a second portion 51B parallel to an extending direction of each of the gate lines GL, and a connecting portion 51C connecting the first portion 51A and the second portion 51B; and a minimum distance h1 between the second portion 51B and each of the gate lines GL is larger than or equal to a minimum distance h2 between the first portion 51A and the each of the gate lines GL, and the pixel electrode 61 covers the second portion 51B.

Figure 11:
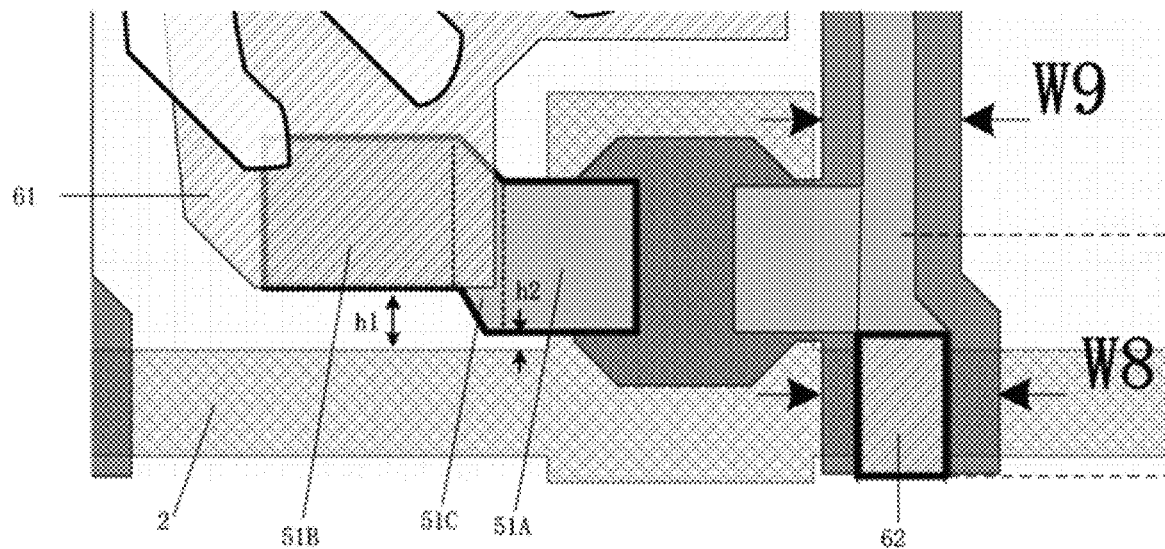
FIG. 11 is an enlarged view of the local structure of a transistor in FIG. 1; and FIG. 12

In some embodiments of the present application, referring to FIG. 11, a minimum distance h1 between the second portion 51B and the each of the gate lines GL is larger than a minimum distance h2 between the first portion 51A and the each of the gate lines GL, and the pixel electrode 61 covers the second portion 51B and a part of the connecting portion 51C.

In an embodiment of the present application, the minimum distance h1 between the second portion 51B and the gate lines GL is set to be larger than or equal to the minimum distance h2 between the first portion 51A and the gate lines GL, and the pixel electrode 61 covers the second portion 51B and a part of the connecting portion 51C, but does not cover the first portion 51A, so that there is a certain safe distance between the pixel electrode 61 and the gate lines GL to avoid signal crosstalk caused by the small distance between the pixel electrode 61 and the gate lines GL.

In an embodiment of the present application, referring to FIG. 5, since there is a climb at the position of the pixel electrode 61 covering the first electrode 51 of the transistor, the pixel electrode 61 near the climbing position, since stress concentration is very easy to produce cracks or gaps, in order to reduce the probability of cracks and gaps, the first electrode 51 is set to include the first portion 51A, the second portion 51B and the connecting portion 51C, and the minimum distance h1 between the second portion 51B and the gate lines GL is larger than or equal to the minimum distance h2 between the first portion 51A and the gate lines GL, the pixel electrode 61 covers the second portion 51B and extends to cover the connect portion 51C, which increases the contacting area between the pixel electrode 61 and the first electrode 51, disperses the internal stress received by the pixel electrode 61 near the climbing position. Thus, the probability of cracks or gaps in the pixel electrode 61 near the climbing position is reduced, and the reliability of the array substrate is improved.

In some embodiments of the present application, referring to FIG. 1 and FIG. 6, the array base plate further includes a semiconductor layer 4 located between the first conducting layer 5 and the third conducting layer 2, a part of a region of the semiconductor layer 4 is in direct contact with the first conducting layer 5; and the semiconductor layer 4 includes a first active portion 41, the orthographic projection of the compensating electrode 62 on the substrate 1 is located within an orthographic projection of the first active portion 41 on the substrate 1, and the orthographic projections of the data lines 53 on the substrate 1 are located within the orthographic projection of the first active portion 41 on the substrate 1.

In an exemplary embodiment, the data lines 53 are located between the first active portion 41 and the compensating electrode 62, and the data lines 53 is in direct contact with the first active portion 41 and the compensating electrode 62, respectively.

In an exemplary embodiment, the orthographic projection of the compensating electrode 62 on the substrate 1 is located in the orthographic projection of the first active portion 41 on the substrate 1, and the orthographic projections of the data lines 53 on the substrate 1 are located within the orthographic projection of the first active portion 41 on the substrate 1, including the following:

For example, referring to FIG. 6, the outer contour of the orthographic projection of the compensating electrode 62 on the substrate 1 is located in the outer contours of the orthographic projections of the data lines 53 on the substrate 1, and the outer contours of the orthographic projections of the data lines 53 on the substrate 1 is located within the outer contour of the orthographic projection of the first active portion 41 on the substrate 1.

As another example, referring to FIG. 7, the outer contour of the orthographic projection of the compensating electrode 62 on the substrate 1 overlaps with the outer contours of the orthographic projections of the data lines 53 on the substrate 1, and the outer contours of the orthographic projections of the data lines 53 on the substrate 1 is located within the outer contour of the orthographic projection of the first active portion 41 on the substrate 1.

Figure 8:
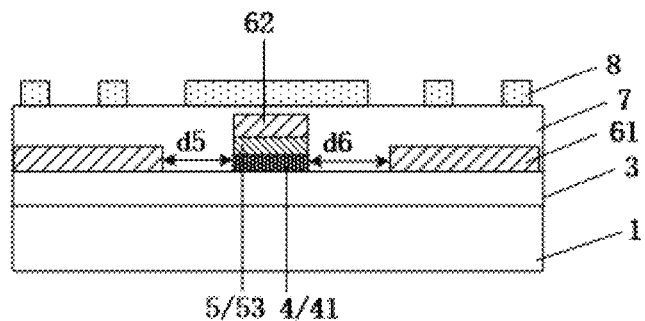

As another example, referring to FIG. 8, the outer contour of the orthographic projection of the compensating electrode 62 on the substrate 1 overlaps with the outer contours of the orthographic projections of the data lines 53 on the substrate 1, and the outer contours of the orthographic projections of the data lines 53 on the substrate 1 overlaps with the outer contour of the orthographic projection of the first active portion 41 on the substrate 1.

In some embodiments, the material of the first active portion 41 may include a semiconductor material.

In some embodiments, the material of the first active portion 41 may include a semiconductor material, and a doped semiconductor material, the doped semiconductor material is located on the surface of the side of the first active portion 41 away from the substrate 1, which can improve the conductivity of the first active portion 41 and make it conductive. At this time, in the process of preparing the data lines 53, even if data lines 53 appears cracks or gaps, the first active part 41 can repair the data line 53 to a certain extent, thus avoiding the data line 53 disconnection.

For example, in the array base plate shown in FIG. 6, the first active portion 41 is not conductive, and the distances d1, d2 between the data lines 53 and the pixel electrodes 61 on both sides of the data lines 53 are larger than or equal to 5 μm to avoid short circuits or signal interference between the data lines 53 and the pixel electrode 61.

For example, in the array base plate shown in FIG. 7, the first active portion 41 is conductive, and the distances d3, d4 between the first active portion 41 and the pixel electrodes 61 on both sides of the first active portion 41 are larger than or equal to 5 μm to avoid short circuits between the first active portion 41 and the pixel electrode 61.

For example, in the array base plate shown in FIG. 8, the first active portion 41 is conductive, and the distance d4, d5 between the first active portion 41 and the pixel electrodes 61 on both sides of the first active portion 41 are larger than or equal to 5 μm to avoid short circuits between the first active portion 41 and the pixel electrode 61.

Figure 4:
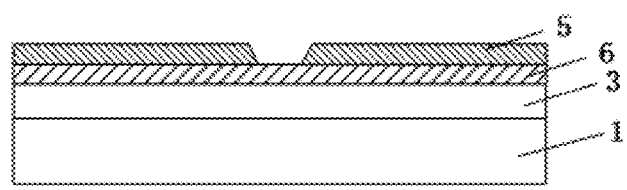
Figure 9:
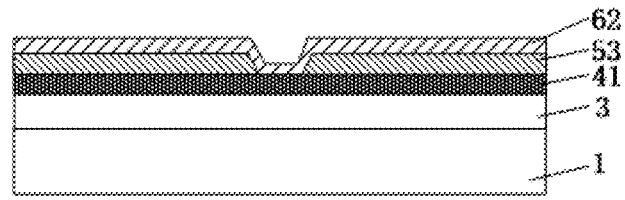

FIG. 4 is the cross-sectional view of the data lines position along the extending directions of the data lines in the related art. FIG. 9 is the cross-sectional view of data lines position in the array substrate along the extending direction of the data lines according to the embodiments of the present application. It can be seen from the comparison that when the data lines in the related art appear cracks or gaps, the data lines are repaired by the conducting layer located below the data lines. In the present application, the first active portion 41 is disposed below the data lines 53, and the compensation electrode 62 prepared in the same layer as the pixel electrode 61 is disposed above the data lines 53. The first active portion 41 and the compensation electrode 62 can simultaneously repair the data lines 53 to avoid its disconnection and greatly improve the preparation yield of the data lines 53 and improves the quality of the array base plate.

In some embodiments of the present application, referring to FIG. 5, the semiconductor layer 4 further includes a second active portion 42, the first active portion 41 and the second active portion 42 are connected, an orthographic projection of the first electrode 51 of the transistor TFT on the substrate 1 and an orthographic projection of the second electrode 52 of the transistor TFT on the substrate 1 are located within an orthographic projection of the second active portion 42 on the substrate 1, respectively; and the pixel electrode 61 further covers a side surface 42M of the second active portion 42 away from the second electrode 52 of the transistor TFT, the pixel electrode 61 is in direct contact with the side surface 42M.

It should be noted that in an embodiment of the present application, since the array substrate is prepared by the 5Mask process, the semiconductor layer 4 and the first conducting layer 5 are prepared in a one-step patterning process, and the outer contour of the orthographic projection of the first conducting layer 5 on the substrate 1 is located within the outer contour of the orthographic projection of the semiconductor layer 4 on the substrate 1. The one-step patterning process includes the processes of exposure, development, etching and so on.

In some embodiments of the present application, referring FIG. 1 and FIG. 5, the array base plate further includes a fourth conducting layer 8, and the fourth conducting layer 8 is located at a side of the second conducting layer 6 away from the substrate 1 and is insulated from the second conducting layer 2; and an interlayer medium layer 7 is disposed between the fourth conducting layer 8 and the second conducting layer 6. An orthographic projection of the fourth conducting layer 8 on the substrate 1 overlaps with an orthographic projection of the pixel electrode 61 on the substrate 1, orthographic projections of the data lines 53 on the substrate 1 and orthographic projections of the gate lines GL on the substrate 1, respectively; and the fourth conducting layer 8 has a plurality of slots 8S, and orthographic projections of regions where the slots 8S are located on the substrate 1 overlap with the orthographic projection of the pixel electrode 61 on the substrate 1.

In an exemplary embodiment, the material of the fourth conducting layer 8 is a light-transmitting conducting material, such as indium tin oxide or zinc tin oxide.

For example, in FIG. 1, the film layer labeled Common ITO represents the fourth conducting layer 8.

In some embodiments of the present application, the third conducting layer 2 further includes a storage electrode line CS disposed parallel to the gate lines GL, the storage electrode line CS is electrically connected to the fourth conducting layer 8 via a through hole (not drawn in FIG. 1); and an orthographic projection of the storage electrode line CS on the substrate 1 overlaps with the orthographic projection of the pixel electrode 61 on the substrate 1, and the orthographic projection of the storage electrode line CS on the substrate 1 overlaps with the orthographic projection of the fourth conducting layer 8 on the substrate 1.

In the array base plate provided in the embodiments of the present application, by disposing the storage electrode line CS; the orthographic projection of the storage electrode line CS on the substrate 1 is overlapped with the orthographic projection of the pixel electrode 61 on the substrate 1. The storage electrode line CS is electrically connected to the fourth conducting layer 8 via the through hole (not drawn in FIG. 1). Thus, it is equivalent to paralleling a capacitor on the storage capacitor composed of the pixel electrode 61 and the fourth conducting layer 8. The capacitance of the storage capacitor is greatly improved, which is beneficial to improve the charging rate of pixels in the array base plate and improving the display effect of the display panel composed of array base plate.

An embodiment of the present application provides a display panel, including an array base plate described above.

The specific structure of the array base plate included in the display panel is not described here, and which may refer to the previous embodiments.

Figure 10:
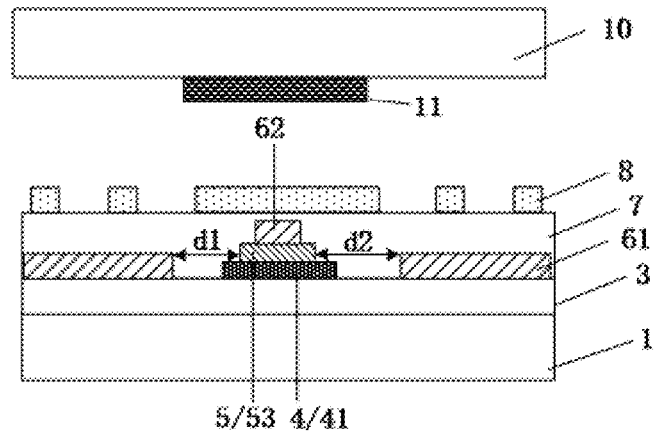
FIG. 10 is a schematic diagram of the structure of a display panel according to an embodiment of the present application.

In an exemplary embodiment, the display panel further includes a second base plate 10 as shown in FIG. 10, and a black matrix layer 11 located on the second base plate 10, wherein an orthographic projection of the black matrix layer 11 on the substrate 1 overlaps with orthographic projections of the data lines 53 on the substrate 1.

A display panel provided in an embodiment of the present application is a liquid crystal display panel (LCD), and in addition, the display panel may be an LCD display and any products or components with display functions including these display devices, such as TV, digital cameras, mobile phones, tablets and so on.

Exemplary, the display panel is the LCD display panel of the advanced super dimension switch (ADS) display mode, wherein the ADS is a core technology represented by wide viewing angle technology.

When the 5Mask process is used to prepare the array base plate, due to the orthographic projection of the first conducting layer 5 of the array base plate of the 5Mask process on the substrate 1 is located within the orthographic projection of the semiconductor layer 4 on the substrate 1, in order to avoid a second conducting layer 6 short-circuited with semiconductor layer 4, in the array base plate according to an embodiment of the present application, a second conducting layer 6 is disposed at one side of the first conducting layer 5 away from the substrate 1, and the second conducting layer 6 includes a pixel electrode 61 and a compensating electrode 62; and the second conducting layer 6 is in direct contact with a part of a region of the first conducting layer 5, further, an orthographic projection of the compensating electrode 62 on the substrate 1 is located within orthographic projections of the data lines 53 on the substrate 1. In this way, while saving a mask and reducing the preparation cost, as shown in FIG. 6, the compensating electrode 62 prepared in the same layer as the pixel electrode 61 is also covered on at least a part of the data lines 53. When cracks or gaps appear in the data lines 53 during the preparation of the array base plate 53, the compensating electrode 62 may play a role in repairing the data lines 53 and avoids data lines 53 disconnecting, thereby improving the preparation yield of the array base plate and improving product efficiency.

Figure 12:
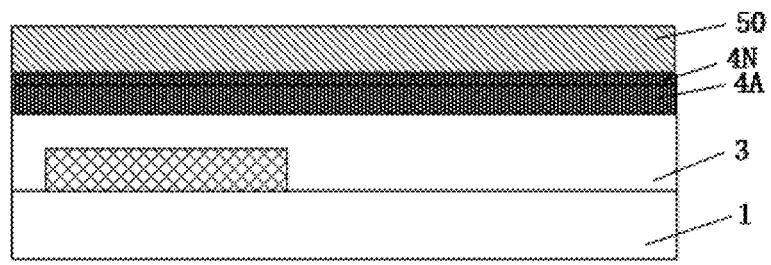

An embodiment of the present application provides a method for manufacturing the array base plate, applied to manufacture the array base plate stated above, the method includes:

S01, providing the substrate 1 as shown in FIG. 12;

S02, forming a semiconductor thin film (for example, including 4A and 4N);

Exemplary, the semiconductor thin film includes the semiconductor thin film 4A and a conducting thin film 4N located on the semiconductor thin film 4A.

In some embodiments, the semiconductor thin film may conduct by doping to obtain a layer of conducting thin film.

S03, forming a first conducting thin film 50;

S04, patterning the semiconductor thin film (for example, including 4A and 4N) and the first conducting thin film 50 at a same time to obtain the semiconductor layer 4 and the first conducting layer 5; wherein the first conducting layer 5 includes the plurality of data lines 53 arranged in the array; and S05, forming a second conducting layer, and the second conducting layer in direct contact with the part of the region of the first conducting layer, and including the pixel electrode and the compensating electrode; wherein the orthographic projection of the compensating electrode on the substrate is located within orthographic projections of the data lines on the substrate.

In related art, for the array base plate prepared by the 6Mask process, referring to FIGS. 2 and 3, the second conducting layer 6 is located between the first conducting layer 5 and the substrate 1, and the first conducting layer 5 covers a part of the second conducting layer 6. However, in order to reduce costs and optimize the process, the 5Mask process is used to prepare the array base plate, due to the orthographic projection of the first conducting layer 5 of the array base plate of the 5Mask process on the substrate 1 is located within the orthographic projection of the semiconductor layer 4 on the substrate 1, in order to avoid a second conducting layer 6 short-circuited with semiconductor layer 4, in the array base plate according to an embodiment of the present application, a second conducting layer 6 is disposed at one side of the first conducting layer 5 away from the substrate 1, and the second conducting layer 6 includes a pixel electrode 61 and a compensating electrode 62; and the second conducting layer 6 is in direct contact with a part of a region of the first conducting layer 5, further, an orthographic projection of the compensating electrode 62 on the substrate 1 is located within orthographic projections of the data lines 53 on the substrate 1. In this way, while saving a mask and reducing the preparation cost, as shown in FIG. 6, the compensating electrode 62 prepared in the same layer as the pixel electrode 61 is also covered on at least a part of the data lines 53. When cracks or gaps appear in the data lines 53 during the preparation of the array base plate 53, the compensating electrode 62 may play a role in repairing the data lines 53 and avoids data lines 53 disconnecting, thereby improving the preparation yield of the array base plate and improving product efficiency.

It should be noted that the array base plates provided in the embodiments of the present application are prepared using the 5Mask process, wherein the 5Mask process refers to that in the preparation process of the array base plate, 5 masks are used. 6Mask process refers to that in the preparation process of the array base plate, 6 masks are used. Since the refinement of the mask and preparation requirements are high, the design and manufacture of the mask occupies an important component of the cost of the display product, saving a mask plate, can reduce the manufacturing cost of the array base plate to a large extent. In the 5Mask process, the semiconductor layer 4 and the first conducting layer 5 are simultaneously prepared by a mask, which greatly reduces the preparation process cost.

Figure 13:
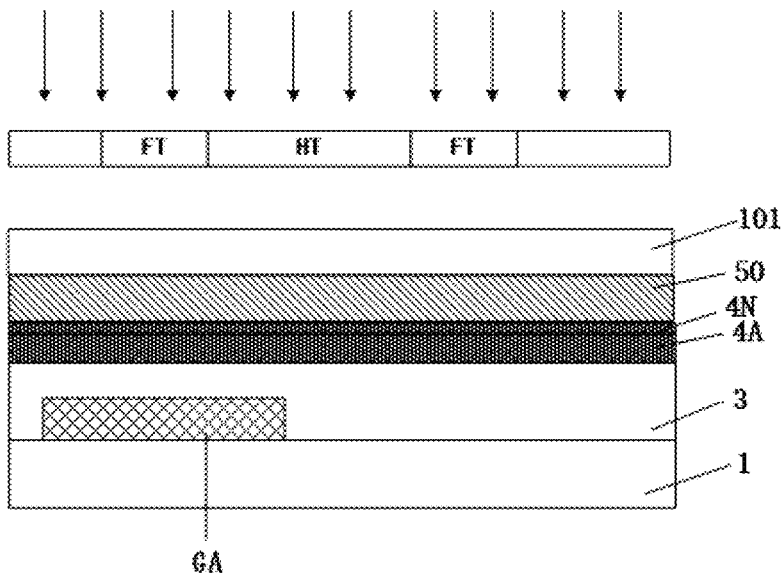
Figure 14:
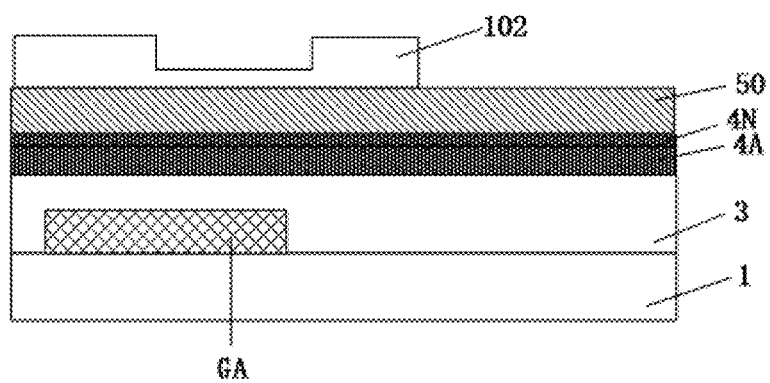
Figure 15:
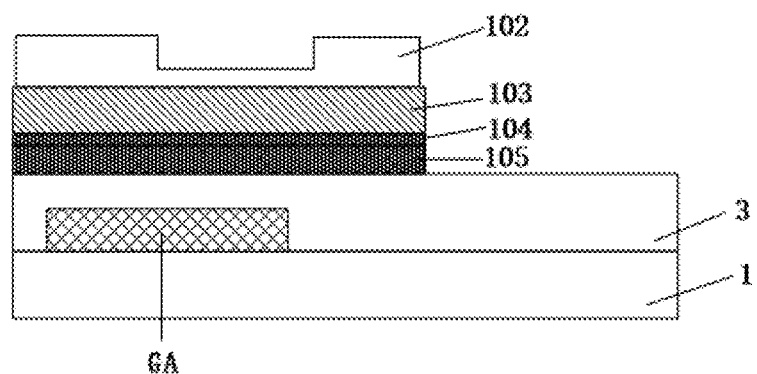

In some embodiments of the present application, S04 patterning the semiconductor thin film (for example, including 4A and 4N) and the first conducting thin film 50 at a same time to obtain the semiconductor layer 4 and the first conducting layer 5 includes:

S041, referring to FIG. 13, forming a light-blocking thin film 101 on the first conducting thin film 50;

S042, patterning the light-blocking thin film 101 by using a halftone mask to obtain a first light-blocking pattern 102 as shown in FIG. 14.

The half tone mask (HTM) refers to the fact that a part of a region of the mask is halftone (HT) and a part of a region of the mask are full tone (FT), wherein half tone and full tone are determined according to the transmittance of the local region in the mask, and the specific content of the halftone mask may refer to the relevant art, which will not be repeated here.

Figure 16:
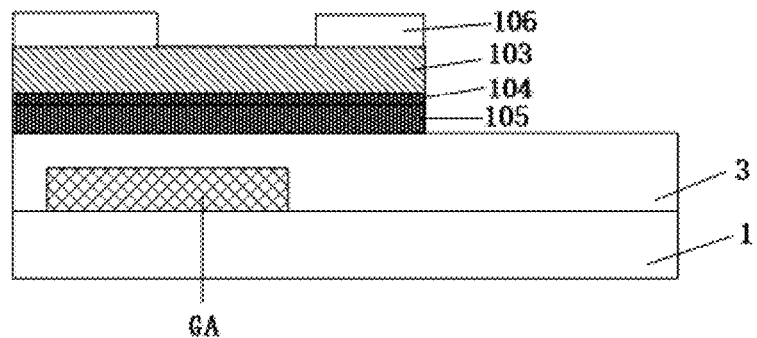
Figure 17:
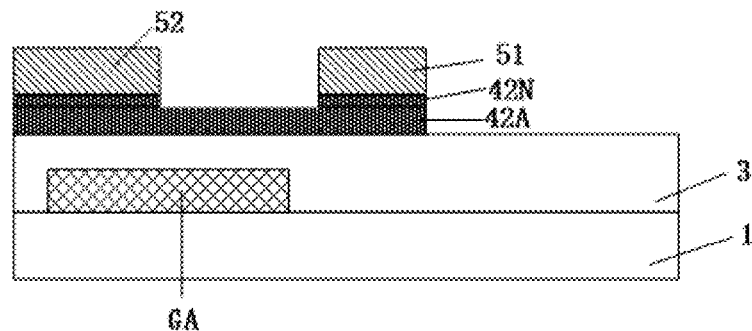

S043, patterning the semiconductor thin film (for example, including 4A and 4N) and the first conducting thin film 50 by using the first light-blocking pattern 102 as a mask, to obtain a first semiconductor pattern (including 104 and 105) and a first conducting pattern 103;

S044, etching the first light-blocking pattern 102 to obtain a second light-blocking pattern 106 as shown in FIG. 16;

S045, patterning the first semiconductor pattern (including 104 and 105) and the first conducting pattern 103 by using the second light-blocking pattern 106 as the mask, to obtain the semiconductor layer 4 and the first conducting layer 5 as shown in FIG. 17 at the same time; and S046, removing the second light-blocking pattern 106.

The first conducting layer 5 includes the first electrode 51 of the transistor and the second electrode 52 of the transistor.

In an exemplary embodiment, the semiconductor layer 4 (the second active portion 42) shown in FIG. 17 includes a semiconductor sublayer 42A and a conducting sublayer 42N which is in direct contact with the first electrode 51 and the second electrode 52 of the transistor.

Figure 18:
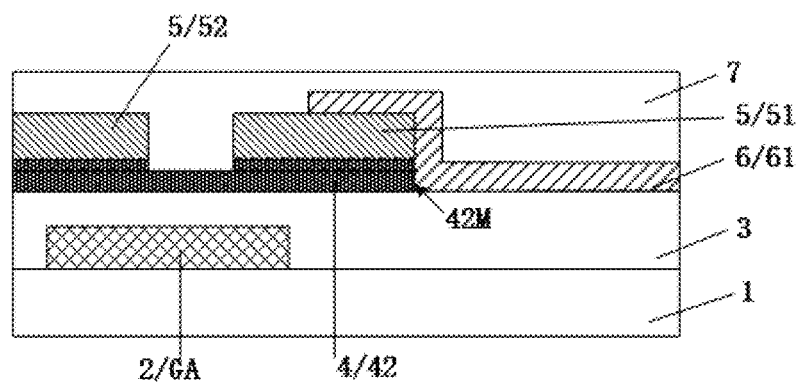
-FIG. 18 is an intermediate structure diagram of a preparation process of an array base plate according to an embodiment of the present application.

After removing the second light-blocking pattern 106, a second conducting layer 6 as shown in FIG. 18, an interlayer medium layer 7, and a fourth conductor layer 8 as shown in FIG. 5 may be formed in turn.

It should be noted that only the structure and film preparation method related to the invention point are introduced here, and the preparation method of other structures of the array base plate may refer to the related art, which will not be repeated here.

The above is only specific embodiments of the present disclosure, but a protection scope of the present disclosure is not limited to this, and any change or substitution which occurs to any person familiar with this technical field within the technical scope disclosed by the present disclosure should be encompassed within the protection scope of the present disclosure. Therefore, protection scope of the present disclosure shall be subject to a protection scope of the claims.

The invention claimed is:

1. An array base plate, comprising:
a substrate;
a first conducting layer located at one side of the substrate, and comprising a plurality of data lines arranged in an array;
a second conducting layer located at one side of the first conducting layer away from the substrate, and in direct contact with a part of a region of the first conducting layer, and comprising a pixel electrode and a compensating electrode;
wherein an orthographic projection of the compensating electrode on the substrate is located within orthographic projections of the data lines on the substrate;
wherein the array base plate further comprises a third conducting layer located between the first conducting layer and the substrate; and the third conducting layer comprises a plurality of gate lines arranged in an array, and the gate lines intersect and are insulated with the data lines;
wherein the array base plate further comprises transistor, and the first conducting layer further comprises a first electrode of the transistor and a second electrode of the transistor, and the pixel electrode is in direct contact with a part of a region of the first electrode of the transistor, and the data lines are connected to the second electrode of the transistor;
wherein the first electrode of the transistor comprises a first portion parallel to an extending direction of each of the gate lines, a second portion parallel to an extending direction of each of the gate lines, and a connecting portion connecting the first portion and the second portion; and
a minimum distance between the second portion and the each of the gate lines is larger than a minimum distance between the first portion and the each of the gate lines, and the pixel electrode covers the second portion and a part of the connecting portion.

2. The array base plate according to claim 1, wherein an extending direction of the compensating electrode and an extending direction of each of the data lines are the same, and in the extending direction of the each of the data lines, a length of the compensating electrode is less than or equal to a length of the each of the data lines.

3. The array base plate according to claim 1, wherein in a direction perpendicular to an extending direction of the data lines, sizes of the orthographic projections of the data lines on the substrate are larger than or equal to a size of the orthographic projection of the compensating electrode on the substrate.

4. The array base plate according to claim 1, wherein
a part of each of the data lines located between two adjacent gate lines comprises a first line segment, a bending part, and a second line segment connected sequentially; and the compensating electrode covers at least a part of regions of the first line segment and the second line segment.

5. The array base plate according to claim 4, wherein the each of the data lines further comprise a third line segment and a fourth line segment, and the third line segment is connected to an end of the first line segment away from the bending part; the fourth line segment is connected to an end of the second line segment away from the bending part; an orthographic projection of the third line segment on the substrate and an orthographic projection of the fourth line segment on the substrate overlap with orthographic projections of the gate lines on the substrate, respectively;
wherein the compensating electrode covers at least a part of regions of the third line segment and the fourth line segment.

6. The array base plate according to claim 5, wherein the compensating electrode covers the first line segment, the second line segment, the third line segment and the fourth line segment.

7. The array base plate according to claim 5, wherein a width of the third line segment along a direction perpendicular to an extending direction of the third line segment is larger than a width of the first line segment along a direction perpendicular to an extending direction of the first line segment; a width of the fourth line segment along a direction perpendicular to an extending direction of the fourth line segment is larger than a width of the second line segment along a direction perpendicular to an extending direction of the second line segment.

8. The array base plate according to claim 7, wherein a width of a part of the compensating electrode covering the third line segment along the direction perpendicular to the extending direction of the third line segment is larger than a width of a part of the compensating electrode covering a main structure of the first line segment along the direction perpendicular to the extending direction of the first line segment; and
a width of a part of the compensating electrode covering the fourth line segment along the direction perpendicular to the extending direction of the fourth line segment is larger than a width of a part of the compensating electrode covering a main structure of the second line segment along the direction perpendicular to the extending direction of the second line segment.

9. The array base plate according to claim 4, wherein the pixel electrode is located at a position defined by two adjacent data lines and two adjacent gate lines, and the minimum distance between the pixel electrode and the compensating electrode is larger than or equal to 5 μm.

10. An array base plate, comprising:
a substrate;
a first conducting layer located at one side of the substrate, and comprising a plurality of data lines arranged in an array;
a second conducting layer located at one side of the first conducting layer away from the substrate, and in direct contact with a part of a region of the first conducting layer, and comprising a pixel electrode and a compensating electrode;
wherein an orthographic projection of the compensating electrode on the substrate is located within orthographic projections of the data lines on the substrate;
wherein the array base plate further comprises a third conducting layer located between the first conducting layer and the substrate; the third conducting layer comprises a plurality of gate lines arranged in an array, and the gate lines intersect and are insulated with the data lines; and
a part of each of the data lines located between two adjacent gate lines comprises a first line segment, a bending part, and a second line segment connected sequentially; and the compensating electrode covers at least a part of regions of the first line segment and the second line segment;
wherein the array base plate further comprises transistor, and the first conducting layer further comprises a first electrode of the transistor and a second electrode of the transistor, and the pixel electrode is in direct contact with a part of a region of the first electrode of the transistor, and the data lines are connected to the second electrode of the transistor;
wherein the array base plate further comprises a semiconductor layer located between the first conducting layer and the third conducting layer, a part of a region of the semiconductor layer is in direct contact with the first conducting layer; and
the semiconductor layer comprises a first active portion, the orthographic projection of the compensating electrode on the substrate is located within an orthographic projection of the first active portion on the substrate, and the orthographic projections of the data lines on the substrate are located within the orthographic projection of the first active portion on the substrate.

11. The array base plate according to claim 10, wherein the semiconductor layer further comprises a second active portion, the first active portion and the second active portion are connected, an orthographic projection of the first electrode of the transistor on the substrate and an orthographic projection of the second electrode of the transistor on the substrate overlap with an orthographic projection of the second active portion on the substrate, respectively; and
the pixel electrode further covers a side surface of the second active portion away from the second electrode of the transistor, the pixel electrode is in direct contact with the side surface.

12. The array base plate according to claim 4, wherein the array base plate further comprises a fourth conducting layer, and the fourth conducting layer is located at a side of the second conducting layer away from the substrate and is insulated from the second conducting layer;
an orthographic projection of the fourth conducting layer on the substrate overlaps with an orthographic projection of the pixel electrode on the substrate, orthographic projections of the data lines on the substrate and orthographic projections of the gate lines on the substrate, respectively; and the fourth conducting layer has a plurality of slots, and orthographic projections of regions where the slots are located on the substrate overlap with the orthographic projection of the pixel electrode on the substrate.

13. An array base plate, comprising:
a substrate;
a first conducting layer located at one side of the substrate, and comprising a plurality of data lines arranged in an array;
a second conducting layer located at one side of the first conducting layer away from the substrate, and in direct contact with a part of a region of the first conducting layer, and comprising a pixel electrode and a compensating electrode;
wherein an orthographic projection of the compensating electrode on the substrate is located within orthographic projections of the data lines on the substrate;
wherein the array base plate further comprises a third conducting layer located between the first conducting layer and the substrate; the third conducting layer comprises a plurality of gate lines arranged in an array, and the gate lines intersect and are insulated with the data lines; and
a part of each of the data lines located between two adjacent gate lines comprises a first line segment, a bending part, and a second line segment connected sequentially; and the compensating electrode covers at least a part of regions of the first line segment and the second line segment;
wherein the array base plate further comprises a fourth conducting layer, and the fourth conducting layer is located at a side of the second conducting layer away from the substrate and is insulated from the second conducting layer;
an orthographic projection of the fourth conducting layer on the substrate overlaps with an orthographic projection of the pixel electrode on the substrate, orthographic projections of the data lines on the substrate and orthographic projections of the gate lines on the substrate, respectively; and
the fourth conducting layer has a plurality of slots, and orthographic projections of regions where the slots are located on the substrate overlap with the orthographic projection of the pixel electrode on the substrate;
wherein the third conducting layer further comprises a storage electrode line disposed parallel to the gate lines, the storage electrode line is electrically connected to the fourth conducting layer via a through hole; and an orthographic projection of the storage electrode line on the substrate overlaps with the orthographic projection of the pixel electrode on the substrate, and the orthographic projection of the storage electrode line on the substrate overlaps with the orthographic projection of the fourth conducting layer on the substrate.

14. A display panel, comprising the array base plate according to claim 1.

15. A method for manufacturing the array base plate, applied to manufacture the array base plate according to claim 10, the method comprises:
providing the substrate;
forming a semiconductor thin film;
forming a first conducting thin film;
patterning the semiconductor thin film and the first conducting thin film at a same time to obtain the semiconductor layer and the first conducting layer; wherein the first conducting layer comprises the plurality of data lines arranged in the array; and
forming a second conducting layer, and the second conducting layer in direct contact with the part of the region of the first conducting layer, and comprising the pixel electrode and the compensating electrode; wherein the orthographic projection of the compensating electrode on the substrate is located within orthographic projections of the data lines on the substrate.

16. The method for manufacturing the array base plate according to claim 15, wherein patterning the semiconductor thin film and the first conducting thin film at a same time to obtain the semiconductor layer and the first conducting layer comprises:
forming a light-blocking thin film on the first conducting thin film;
patterning the light-blocking thin film by using a halftone mask to obtain a first light-blocking pattern;
patterning the semiconductor thin film and the first conducting thin film by using the first light-blocking pattern as a mask to obtain a first semiconductor pattern and a first conducting pattern;
etching the first light-blocking pattern to obtain a second light-blocking pattern;
patterning the first semiconductor pattern and the first conducting pattern by using the second light-blocking pattern as the mask, to obtain the semiconductor layer and the first conducting layer at the same time; and
removing the second light-blocking pattern.

* * * * *